United States Patent [19]

Jansen et al.

[11] Patent Number: 4,620,314

[45] Date of Patent: Oct. 28, 1986

[54] METHOD OF GENERATING AN APPROXIMATELY SINUSOIDAL SIGNAL AND CIRCUIT ARRANGEMENT FOR IMPLEMENTING THIS METHOD, PARTICULARLY IN A STEREO DEMODULATOR

[75] Inventors: Winfried Jansen, Hasloh; Wolfgang Nolde, Hamburg, both of Fed. Rep. of Germany

[73] Assignee: U.S. Philips Corporation, New York, N.Y.

[21] Appl. No.: 592,663

[22] Filed: Mar. 23, 1984

[30] Foreign Application Priority Data

Mar. 26, 1983 [DE] Fed. Rep. of Germany ....... 3311072

[51] Int. Cl.$^4$ ............................................. H04H 5/00
[52] U.S. Cl. ........................................ 381/4; 364/721; 328/22; 328/158; 307/261
[58] Field of Search ................... 307/261; 328/14, 22, 328/158; 364/608, 852, 858, 718, 721; 381/2, 3, 4

[56] References Cited

U.S. PATENT DOCUMENTS

| | | | |
|---|---|---|---|
| 3,512,092 | 5/1970 | Thurnell | 328/22 |
| 4,044,310 | 8/1977 | Morrow et al. | 307/261 |
| 4,076,963 | 2/1978 | Fujie et al. | 381/4 |
| 4,130,876 | 12/1978 | Mitsuhashi | 328/14 |

FOREIGN PATENT DOCUMENTS 0896415 5/1962 United Kingdom ................. 328/22

*Primary Examiner*—Forester W. Isen
*Attorney, Agent, or Firm*—Thomas A. Briody; William J. Streeter; Marianne R. Rich

[57] ABSTRACT

An approximately sinusoidal signal is generated by superimposing a first signal, which has a half cycle duration and corresponds to a triangular signal which is suppressed during every second half cycle, on a second triangular signal, every second waveform of the superimposed signal thus obtained being inverted.

15 Claims, 5 Drawing Figures

Fig.4
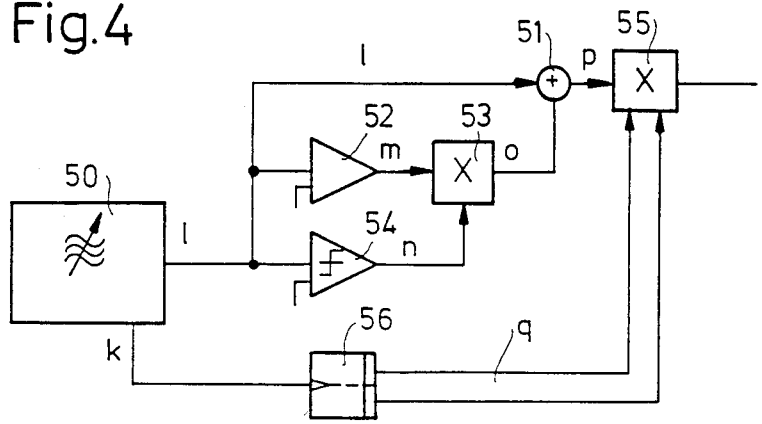
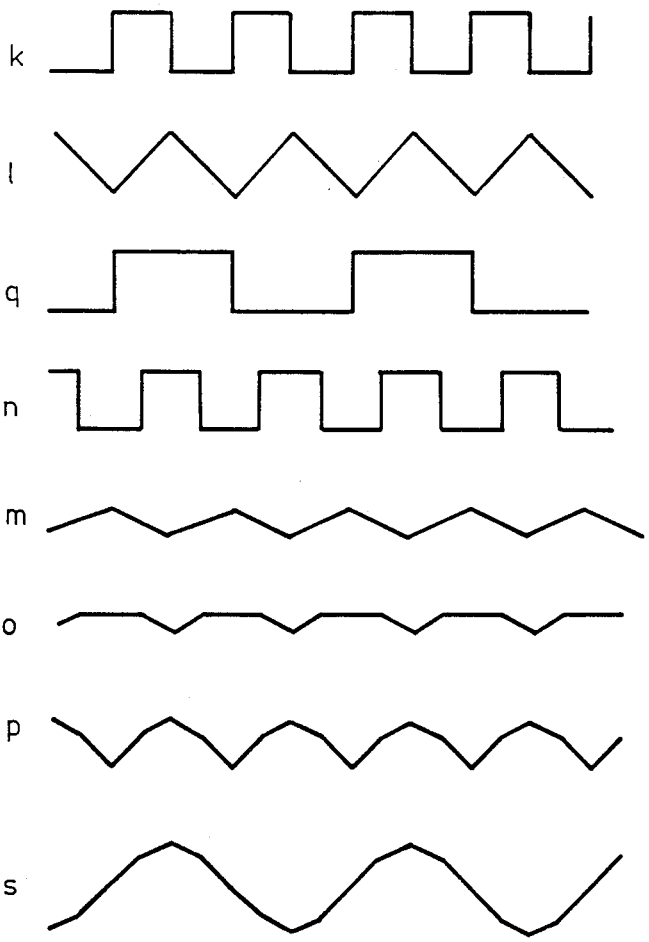
Fig.5

METHOD OF GENERATING AN APPROXIMATELY SINUSOIDAL SIGNAL AND CIRCUIT ARRANGEMENT FOR IMPLEMENTING THIS METHOD, PARTICULARLY IN A STEREO DEMODULATOR

BACKGROUND OF THE INVENTION

1. Field of the Invention

The invention relates to a method of generating an approximately sinusoidal signal from triangular signals and to a circuit arrangement for implementing this method.

2. Description of the Prior Art

Such a method is known in essential from the book by Graeme, Toby and Huelsman: "Operational Amplifiers in Nonlinear Circuits" McGraw-Hill, 1971, page 259, FIG. 7.27a. Here, a diode function generator, which has parts of the characteristic with different gradient, is used to generate from a triangular signal a period signal which has a certain similarity with a sine-wave oscillation. One disadvantage of the known method lies in the fact that the approximately sinusoidal output signal of the diode function generator changes not only its amplitude but also its shape when the amplitude of the supplied triangular signal varies.

Sinusoidal signals can in fact be generated by means of suitable sine-wave oscillators, but such oscillators require either suitable oscillating circuit elements, e.g. quartz crystals, or inductances and cannot therefore be produced as an integrated circuit at a reasonable cost. On the other hand, however, particularly in the case of stereo demodulators, there is a desire for a signal with the frequency of the pilot sound or of the subcarrier which is as sinusoidal as possible.

Originally, square-wave signals with the desired frequency were used, but these deviated a relatively large amount from the sinusoidal. In particular, the third harmonic of the fundamental frequency contained therein considerably impairs the properties of a demodulator using these oscillations. DE-OS 27 39 668 describes the use of a triangular signal whose third harmonic is smaller by a factor of three than that of a square-wave signal in place of a square-wave signal. Finally, U.S. Pat. No. 4,300,019 describes the generation of a three-stage, periodic square-wave signal which is formed in such a way that no third harmonics occur. The cost of generating such a signal is, of course, relatively high, and in some applications, for example when a sinusoidal (pilot) signal is to be compensated by another signal, it is not simply a matter of the third harmonic disappearing, but is also important that its variation with time corresponds as exactly as possible with that of a sinusoidal signal.

SUMMARY OF THE INVENTION

The object of the present invention is a method for generating a signal, whose behaviour with time corresponds largely with that of a sinusoidal signal, from triangular signals.

In order to achieve this object, the invention is characterized in that a first signal is formed, which corresponds to a triangular signal, in which every second triangular half wave is suppressed, the cycle duration of the first signal being half of that of the approximately sinusoidal signal being generated and that a second, triangular signal is superimposed on the first signal, and every second waveform of the superimposed signal thus formed in inverted.

In a first embodiment of the invention, the frequency of the second signal is four times as great as that of the signal being generated, its amplitude is a factor of $\sqrt{2}$ smaller than that of the first signal, and the two signals are superimposed such that the superimposed signal represents the difference of the two signals. In a second embodiment, the frequency of the second signal is twice as large as that of the signal being generated, its amplitude is greater by a factor of $2+\sqrt{2}$ than that of the first signal and the two signals are superimposed such that the superimposed signal represents the difference between the two signals.

The superimposed signal is obtained therefore in both cases by formation of the difference between the first signal and the second signal, i.e. the first and the second signal are either added with opposite phase or subtracted with like phase; "like phase" here means that the peaks of the first signal coincide with peaks of the same polarity in the second signal.

In this case, the superimposed signal has the shape of a periodic bell curve approximated by straight lines. The fact that every second waveform, i.e. every second bell curve is inverted, produces a signal which at the times $nT/8$ ($n=$ a whole number, $T=$ the cycle duration of the signal) corresponds exactly to a sinusoidal signal, and the remaining curve of this signal is a linearly rising or falling curve between the amplitude values at the said points.

Such a signal has no even-numbered harmonic and no third and fifth harmonic; the seventh and ninth harmonics are not very pronounced.

One advantage of this method in its application in a stereo demodulator lies, moreover, in the fact that the necessary triangular waveforms and any further auxiliary signals are already present anyway in the integrated circuits so far known for stereo demodulation (e.g. TDA 1578).

A circuit for implementing the first variant of the method according to the invention is characterized by means for feeding a first triangular signal to a first changeover switch which is switched at twice the frequency of the signal to be generated and, each time, at either the minimum or the maximum of the first triangular signal, and means for feeding the superimposed signal formed by the superimposition of the output signal of the first changeover switch on the second triangular signal to a second changeover switch which is switched at the frequency of the signal to be generated, at the minimum of the superimposed signal each time, the output signals of the changeover switch being fed to a subtraction circuit which forms the difference between these signals.

Because only an output signal is required of the first changeover switch, an ordinary switch can also be used instead of this.

An advantageous embodiment of the invention is characterized by a first and second power source, the second power source being arranged in the emitter branch of the first changeover switch formed by two emittercoupled transistors, a first square-wave voltage of twice the frequency, the edges of which coincide either with the minima or the maxima of the first triangular signal being supplied to the base connections of the two transistors there is, the collector of the one transistor being coupled to the first power source and the two emitters of two transistors forming the second changeover switch, a square-wave voltage with the frequency of the signal to be generated, the edges of this voltage coinciding with the minima of the current fed to the emitters of these transistors being supplied to the base connections of the two transistors forming the second changeover switch, and the approximately sinusoidal signal which is to be generated being derived from the collector currents of the two transistors. Such a circuit can be implemented relatively simply in integrated circuit technology.

The subtraction of the output signals of the second changeover switch can be achieved in a particularly simple manner in a further embodiment of the invention as follows: the collector of one of the transistors forming the second changeover switch is connected to the input of a current mirror circuit the output of which is connected to the collector of the other transistor. At the collector of the transistor containing the second changeover switch which is connected to the output of the current mirror circuit there is now a current which has the specified response with respect to time.

If the triangular voltages and the square-wave voltages were generated by independent generators, undesired phase variations could occur. A further development of the invention prevents this by having the triangular and square-wave signals derived from the oscillations of one generator.

A circuit for implementing the second alternative of the method according to the invnetion is characterized by an oscillator for supplying a symmetrical square-wave signal and a triangular signal with twice the frequency of the signal to be generated, whereby each extreme value of the triangular signal coincides with an edge of the square-wave signals, the triangular signal being fed to a superimposition circuit via two channels, means for suppressing each halfwave in the one channel, the transmission factor in this channel being smaller by approximately a factor of 1.7 than that of the other channel, and the superimposition circuit being connected to a circuit, controlled by the square-wave signal, for inverting every second waveform of the superimposed signal. For this purpose, therefore, only triangular oscillations with twice the frequency of the signal to be generated are required.

Because of the above-described largely sinusoidal behaviour of the signal generated with the method or the circuit of the invention, this method or circuit is particularly suitable for use in a receiver for the compensation of the pilot signal contained in a received stereo signal, and in particular when the signal relieved of the pilot signal is then fed to an interference blanker circuit which comprises an interference detector controlled switch in a shunt arm and a storage capacitor. With such a circuit it is important in fact that the signal which is to compensate the received pilot signal is as precisely sinusoidal as possible.

BRIEF DESCRIPTION OF THE DRAWING

The invention is explained in greater detail below with the aid of the drawing which show.

DESCRIPTION OF THE PREFERRED EMBODIMENTS

Figure 1:
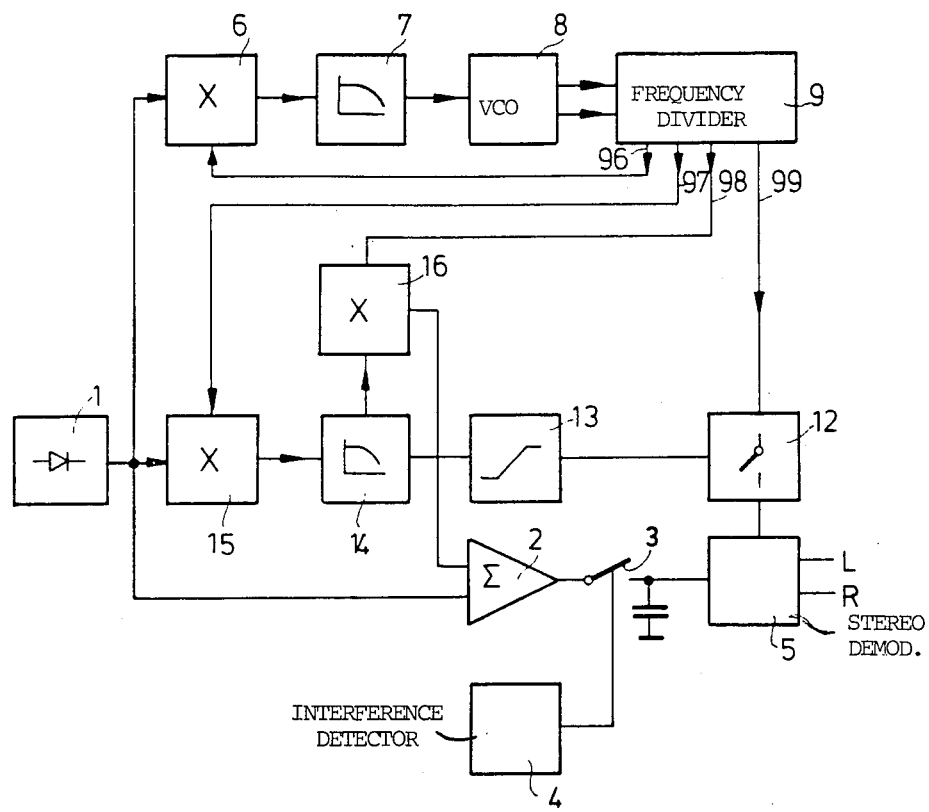
FIG. 1 block circuit diagram of a part of a stereo receiver in which the circuit according to the invention can be used, FIG. 2 a circuit diagram of the invention circuit contained therein, and FIGS. 3a to 3i the waveforms of the signals at points a to i the circuit in FIG. 2, FIG. 4 another embodiment, FIGS. 5k to 5s the waveforms of the signals occurring in the circuit of FIG. 4.

The part of the circuit shown in FIG. 1 comprises an FM-demodulator 1, the output signal of which is fed via an adding or subtracting circuit 2 to a switch 3 the switching state of which is controlled by an interference detector in such a way that in normal operation switch 3 is closed and in the event of interference is open. The value of the output voltage occurring immediately before the interference is stored by a storage capacitor the voltage of which is fed to the input of a stereo demodulator 5.

The subcarrier for this stereo demodulator is generated by a PLL circuit which is connected to the output of the FM-demodulator. This circuit contains a phase comparison stage in the form of a multiplier circuit 6 the output signal of which is filtered by a low-pass filter 7 the output signal of which for its part controls the frequency of a voltage-controlled 76 kHz square-wave oscillator 8 the output signal of which is fed to a circuit 9 which frequency-divides and shapes the oscillator signal. One output 96 of circuit 9 which supplies a 19 kHz signal is connected to a second input of the multiplier circuit 6. If the signals fed to the two inputs of the multiplier circuit 6 have the same frequency and a 90°-shifted phase (so that the zero crossings of the one signal are offset by a quarter period with respect to the zero crossings of the other signal), the output voltage of the multiplier circuit is zero and the frequency of the oscillator retains its instantaneous value. In all other cases the frequency of the oscillator 8 is controlled by the output signal of the multiplier circuit 6, which then differs from zero, in such a way that the specified frequency and phase conditions are obtained.

At one output 99, circuit 9 delivers a 38 kHz signal the edges of which coincide with zero crossings of the pilot signal. This square-wave signal is fed to a controllable switch 12 the output of which is connected to the subcarrier of the stereo demodulator 5.

Switch 12 is controlled by a threshold switch 13 the input of which is connected via a low-pass filter 14 to a second multiplier circuit 15, which multiples the output signal of the FM-demodulator by the output signal at an output 97 of circuit 9. At this output there is a 19 kHz square-wave signal, the edges of which in the steady state coincide with the zero crossings of the pilot signal at the output of the FM-demodulator. The output signal of the multiplier circuit is dependent therefore only on the amplitude of the pilot signal contained in the demodulator output signal, and in fact it increases as the amplitude of the pilot signal increases. If the amplitude of the output signal of the multiplier circuit 15 falls below a certain value, then the switch 12 is opened via the low-pass filter 14 and the threshold switch 13 so that the received signal can only be processed monaurally. If, on the other hand, the amplitude of the output signal is greater, switch 12 is closed so that stereophonic reception is possible. In principle, a sliding monostereo transition is also possible but this requires, of course, the replacement of switch 12 and the threshold switch 13 controlling it by continuously operating transfer elements.

At a fourth output 98 of circuit 9 appears the almost sinusoidal signal which is to be generated the frequency of which is identical with that of the pilot signal and the zero crossings of which coincide with those of the pilot signal at the output of the FM-demodulator 1. This signal is fed to a further multiplier state 16, the transmission factor of which is controlled by the output signal of the low-pass filter 14 in such a way that the amplitude of the output signal of circuit 16 corresponds to the amplitude of the pilot signal contained in the received signal. The output signal is fed to a second input of circuit 2 and added here to the pilot signal (if the pilot signal and the output signal of the multiplier circuit have the same polarity; otherwise the two signals are subtracted from one another).

Because of this compensation, the output signal of circuit 2 no longer contains a pilot signal so that the residual interferences which would otherwise occur when switch 3 is opened (cf. DE-PS 20 52 098) cannot occur, and means for eliminating this residual interference—e.g. a parallel resonant circuit, tuned to 19 kHz, in series with the storage capacitor—are superfluous.

Figure 2:
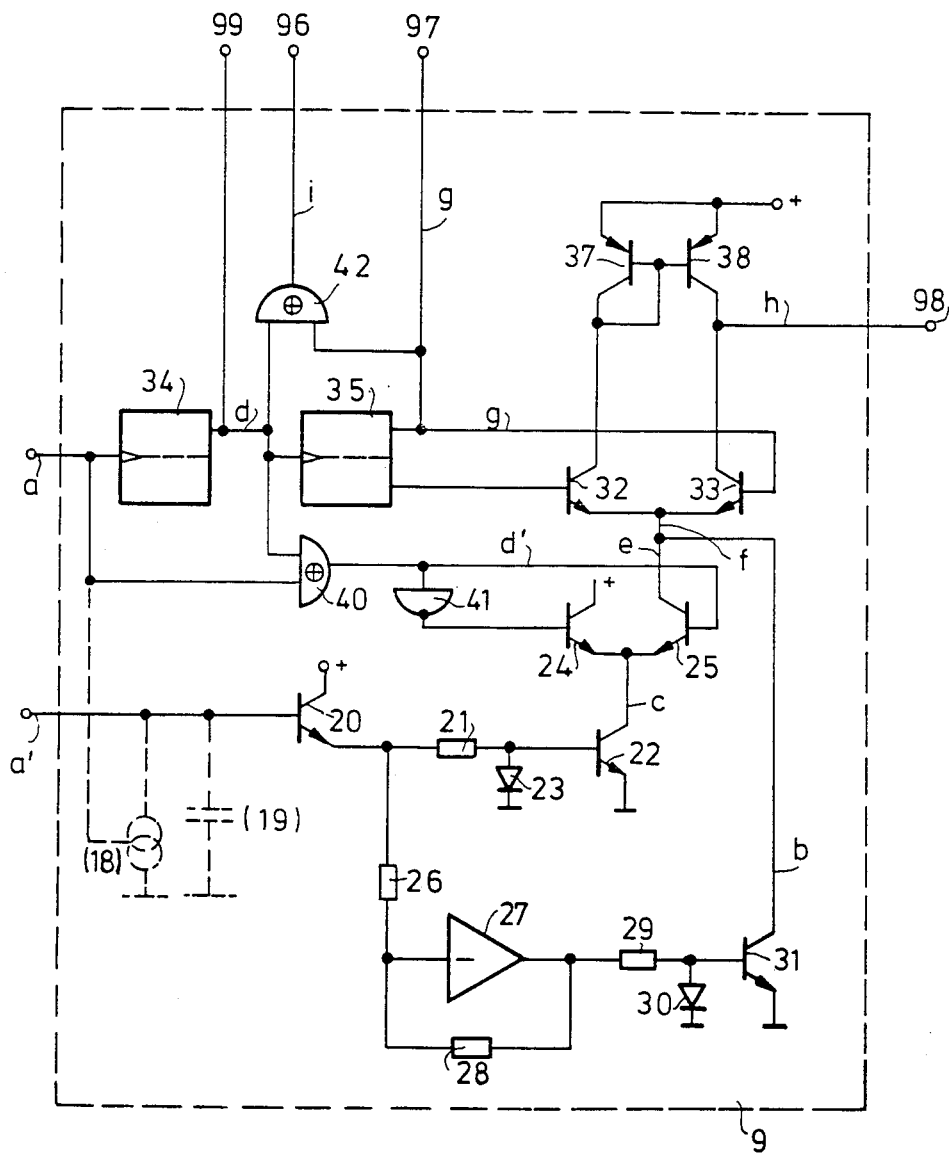

The configuration of circuit 9 is illustrated in FIG. 2. The 76 kHz square-wave signal (cf. FIG. 3a) of the voltage-controlled oscillator 8 is fed to the input a of this circuit. It controls a switchable power source 18, which either charges or discharges a capacitor 19, the charging and discharging currents being equal to one another. A symmetrical triangular voltage appears, therefore, at capacitor 19. In many stereo demodulators voltage-controlled oscillators with switched power sources are used. In such demodulators, an external capacitance is charged by a power source which, when the final voltage value on the capacitor is reached, changes the sign. If such an oscillator were used, the triangular wave would not need to be generated first in circuit 9; as indicated by the broken line, the poewr source 18 and the capacitor 19 could then be omitted and the triangular signal would then have to be fed to the input a' of circuit 9.

This input signal or the voltage across capacitor 19 is fed to the base of a transistor 20, connected as an emitter follower, the emitter of which is connected via a resistor 21 to the base of a transistor 22 the emitter of which is connected to ground. Connected in parallel with the base-emitter section is a diode 23 which is implemented in integrated circuit form as a transistor with short-circuited base-collector section and has the same characteristic as the base-emitter section of transistor 22. Together they form a current mirror which converts the triangular input current defined by the resistor 21 into a corresponding output current (FIG. 3c) at the collector c of the transistor.

The collector of transistor 22 is connected to a first changeover switch which is formed by two npn transistors 24 and 25, the emitters of which are connected to one another and to the collector of transistor 22. The collector of transistor 24 is connected to a positive supply voltage. The two transisitors 24 and 25 are rendered conductive and blocked in push-pull operation by a 38 kHz square-wave voltage (FIG. 3d') which is produced by an exclusive-or gate 40 the output of which is connected with the base of transistor 25 directly and with the base of transistor 24 via a not element 41. The input signal at input a is fed to one of the inputs of this exclusive-or gate directly and to the other input by way of a flip-flop 34 switched by the negative edges of the input signal. Moreover, the output of flip-flop 34 forms output 99 of circuit 9. The signal at this output is shown in FIG. 3d.

This control of transistor 24 and 25 has the result that in the collector current of one of transistors 24 and 25 one of two successive triangular oscillations is suppressed each time so that the current waveform shown in FIG. 3e is obtained at the collector e of transistor 25.

The emitter of transistor 20 moreover, is connected via a resistor 26 with the inverting input of an operational amplifier 27 the output of which is connected via a resistor 28 with the inverting input. The resistors 26 and 28 are in the ratio $\sqrt{2}:1$ to one another so that the output signal of the operational amplifier is smaller by the factor $\sqrt{2}$ than the signal at the emitter of transistor 20 and is also phase-shifted by 180° with respect to this signal. This signal is fed via a resistor 29 to a current mirror which consists of a diode 30 and the base-emitter section of a transistor 31 connected in parallel with it, the collector of which is connected to the collector of transistor 25. The current at collector b of transistor 31, therefore, has the waveform shown in FIG. 3b; it is smaller, therefore, by the factor $\sqrt{2}$ than the current at the collector of transistor 22 (FIG. 3c) and is also phase-shifted by 180° with respect to it. This result can also be obtained by another circuit; for example, the inverter amplifier 26 . . . 28 can exhibit the gain $-1$ if the resistor 29 is greater by the factor $\sqrt{2}$ than resistor 21.

The interconnected collectors of transistors 25 and 31 are connected to a second changeover switch which is formed by the npn transistors 32 and 33 the emitters of which are connected to one another and to the said collectors. The total current fed to the two emitters at the common connection point f in FIG. 2 has the waveform shown in FIG. 3f which represents a periodic approximately bell-shaped signal with a frequency of 38 kHz.

At this point it should be mentioned that the d.c. components are not shown to scale. This is not essential, however, because the d.c. component is eliminated in any case by the further circuit.

The changeover switch consisting of transistors 32 and 33 is controlled by a 19 kHz voltage which is produced from the output signal of flip-flop 34 with the aid of a subsequently connected flip-flop 35 which also responds to the negative edges. The signals at the two complementary outputs of flip-flop 35 are square-wave signals the edges of which coincide with the zero crossings of the approximately sinusoidal signal being generated or with the zero crossings of the pilot signal contained in the output signal of the FM-demodulator 1. The signal from one of these inputs (waveform g) is fed to the output 97 of circuit 9 and, at the same time, to one input of an exclusive-or circuit 42, the other input of which is connected to the input of flip-flop 35 or the output of flip-flop 34 respectively. The output of the exclusive-or circuit forms the output 96 of the circuit. From this output can be taken a 19 kHz square-wave signal (curve form FIG. 3i) switch is offset by a quarter period with respect to the signal at output 97 or with respect to the pilot signal, as the case may be.

As FIGS. 3f and 3g show, the edges of the square-wave voltage between the bases of transistors 32 and 33 coincide with the minima of the collector current supplied by transistor 25, for which the time differential quotient of this signal exhibits its greatest jump. Consequently, one of two successive waveforms of the current depicted in FIG. 3f flows each time across the collector-emitter section of each of the two transistors 32 and 33—and on each occasion in the time domain between the defined minima.

The collector of transistor 32 is connected to the input of a current mirror which is formed by the two pnp transistors 37 and 38, of which transistor 37 is connected as a diode and joined to the collector of transistor 32, whereas the collector of transistor 38 the base-emitter section of which is connected in parallel with diode 37 is connected to the collector of transistor 32. The waveforms of the two collector currents of transistors 32 and 33 which occur during push-pull operation are thereby subtracted. At the connection point h of the collectors of transistors 33 and 38, which forms the output 98 of the circuit, a current is produced therefore with the waveform shown in FIG. 3h which is fed to the multiplier stage 16 either directly or via a suitable current-voltage transformer.

During the first eighth period of the current oscillation at point h, the current varies linearly with time from zero to the value $\sqrt{2}/2$ (with respect to the amplitude of the collector alternating current of transistor 22). During the second eighth period, the current varies linearly with time up to the value which is defined by the maximum of the current at point c and which is a factor of $\sqrt{2}$ greater than the current at the end of the first period, i.e. it corresponds to the current at point c (measured from peak to peak). In the third eighth period the current sinks again linearly to $\frac{1}{2}\sqrt{2}$ of its maximum value and in the fourth eighth period it falls with an even greater gradient to the value zero. In the fifth to eighth eighth periods, the above-described process is repeated—with, of course, the signs reversed. At the time nT/8, where n is a whole number and T is the period duration, the current waveform corresponds on each occasion therefore exactly with that of a sinusoidal alternating current with the same amplitude. Between these times the sinusoidal waveform is approximated by a straight line so that—to all appearance—the result is a relatively slight deviation from the ideally sinusoidal shape. Furthermore, the waveform produced has no third harmonics; it is very suitable therefore for the compensation of the sinudoidal pilot signal. In principle, the subcarrier for controlling the demodulator 5 in FIG. 1 could be generated in a corresponding manner. In that case the oscillator 8, of course, would have to have double the frequency (152 kHz).

FIG. 4 illustrates a circuit which can also produce the above-described, approximately sinusoidal signal, but requires for this purpose square-wave voltages and triangular voltages with only twice the frequency of the signal to be generated. An oscillator 50 whose frequency is electronically controllable supplies a symmetrical square-wave voltage at a first output k and a symmetrical triangular voltage at a second output 1, the edges of the square-wave voltage coinciding with the peaks, i.e. the reversal points, of the triangular voltage. The two signals are designated in FIG. 5 by k and 1. They have double the frequency of the approximately sinusoidal signal to be generated. The triangular signal 1 is fed to one input of an adding circuit 51 directly and to the other input via an inverting amplifier 52 and a multiplier stage 53. The inverting amplifier 52 forms the difference between the mean value of the triangular signal at the input and the instantaneous value of the triangular signal. Its gain factor is $2(1-1\sqrt{2})$, i.e. this amplifier makes the triangular signal smaller by a factor of 1.7 than the triangular signal which is fed directly to one input of the adding circuit and, what is more, inverts it. The output signal of this amplifier is designated in FIG. 5 by m. In the multiplying stage 53 the output signal of the amplifier is multiplied by a square-wave signal n which is phase-shifted by a quarter period with respect to the signal at the output k of the oscillator and is generated by a comparator circuit 54 which compares the instantaneous value of the triangular signal with its mean value. As a result, the output signal o of the multiplying stage 53 has a shape corresponding to that of signal 52, but every second (positive) halfwave is suppressed. If the square-wave voltage at the output of the comparator circuit 54 were phase-shifted by 180°, the multiplying stage would supply an output signal in which every negative halfwave of the triangular signal m would be cut off. The signal obtained corresponds to the signal which would arise if every second waveform—on each occasion between the positive or negative points of reversal—of a triangular voltage with double the frequency of signal 1 were suppressed.

Because the triangular signal 1 and the output signal o of the multiplying circuit 53 are added in the adding circuit 51, the result is the output signal p which represents a periodic bell curve appoximated by straight lines. If the amplifier 52 did not invert the signal, the same output signal p would be obtained if the signals in stage 51 were subtracted.

The output signal p of the adding stage 51 is fed to one input of a multiplying stage 55 and is multiplied here by a square-wave voltage q which is derived from the two complementary outputs of a flip-flop 56, to the input of which the square-wave signals k are fed. The circuit shown in FIG. 2 and consisting of transistors 32, 33, 37 and 38 can be used as the multiplying stage. Because the edges of the square-wave voltage q coincide each time with the minima of the signal, i.e. with the points of this signal at which the differential quotient experiences the sharpest fluctuation, a signal s, in which every second waveform is inverted in respect of signal p, appears at the output of the multiplying circuit 55.

Figure 3:
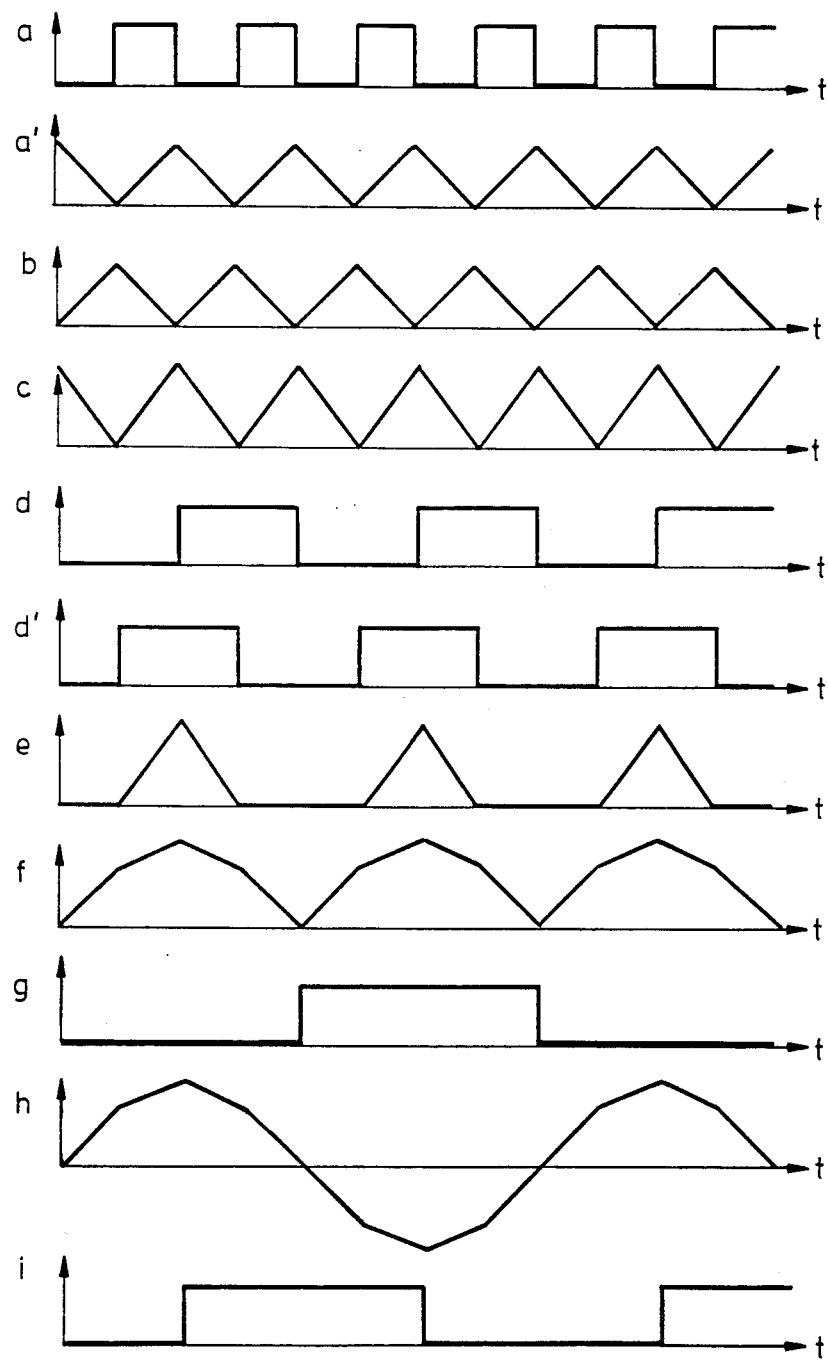

A comparison shows that the signals e, f, g, h of FIG. 3 are identical with the signals o, p, q and s. The two methods or circuits, as the case may be, may also therefore be combined with one another. For example, the triangular signal 1 with double the frequency of the signal to be generated could be derived from a triangular signal of four times the frequency by multiplying this triangular signal (e.g. the signal a' in FIG. 3) by a square-wave voltage (d' in FIG. 3), the frequency of which is double that of the signal to be generated. Also, the signal o could be generated from a triangular voltage of four times the frequency, every second waveform of which is suppressed.

What is claimed is:

1. Method for generating an approximately sinusoidal signal having a predetermined period, comprising the steps of:
  generating a first signal having a first signal period equal to one-half of said predetermined period, said first signal comprising a triangular wave shape extending over one-half of each of said first signal period and a constant value during the remainder of said first signal period;
  superimposing a second triangular signal onto said first signal, thereby generating a combined signal; and
  inverting alternate half waves of said combined signal, thereby creating said approximately sinusoidal signal.

2. A method as claimed in claim 1, wherein said second triangular signal has a second triangular period one-quarter of said predetermined period;
wherein said first signal has a first signal amplitude, and said second triangular signal has a second signal amplitude equal to said first signal amplitude divided by $\sqrt{2}$; and
wherein said step of superimposing said second triangular signal on said first signal comprises the step of generating a combined signal corresponding to the difference between said first and second triangular signals.

3. A method as claimed in claim 1, wherein said second triangular signal has a second signal period equal to one-half of said predetermined period;
wherein said first signal has a predetermined amplitude, and said second signal has a second signal amplitude exceeding said predetermined amplitude by a factor of $2+\sqrt{2}$; and
wherein said step of superimposing said second triangular signal onto said first signal comprises the step of creating a combined signal equal to the difference therebetween.

4. Apparatus for generating an approximately sinusoidal signal having a predetermined period, comprising:
means for generating a first signal having a period equal to one-half of said predetermined period, said first signal comprising a triangular wave shape extending over one-half of each of said first signal period and a constant value during the remainder of said first signal period;
means connected to said first signal generating means for superimposing a second triangular signal onto said first signal, thereby creating a combined signal; and
means connected to said superimposing means for inverting alternate half waves of said combined signal, thereby creating said substantially sinusoidal signal.

5. Apparatus as claimed in claim 4, wherein said means for generating a first signal comprises means for generating a first triangular signal having a period equal to one-quarter said predetermined period and having a predetermined maximum amplitude and a predetermined minimum amplitude, and means connected to said first triangular signal generating means and responsive to said predetermined maximum amplitudes or said predetermined minimum amplitudes for suppressing said first triangular signal during alternate periods thereof.

6. Apparatus as claimed in claim 4, wherein said approximately sinusoidal signal has a frequency matched to the frequency of a pilot signal received in a radio receiver.

7. Apparatus as claimed in claim 6, further comprising means for compensating for said pilot signal with said approximately sinusoidal signal.

8. Circuit arrangement as claimed in claim 6, further comprising an interference blanker circuit comprising a switch in a series arm and a capacitor in a shunt arm connected to said means for compensating for said pilot signal.

9. Apparatus as claimed in claim 4, wherein said first signal generating means comprises means for generating a triangular oscillation having a period equal to one-half said predetermined period and having a predetermined maximum amplitude alternately at a first and second polarity, and means for suppressing half waves of a preselected one of said first and second polarity.

10. Apparatus as claimed in claim 9, wherein said predetermined period corresponds to a predetermined frequency; and
wherein said means for generating said first signal comprises second oscillator means for generating a symmetrical square wave signal and a triangular signal having twice said predetermined frequency and a maximum and minimum amplitude, said square wave signal having edges coinciding with said maximum and minimum amplitudes of said triangular signal, first channel means interconnecting said second oscillator means and said superimposing means, said first channel means having a predetermined transmission factor, second channel means interconnecting said second oscillator means and said superimposing means, said second channel means having a transmission factor smaller than said predetermined transmission factor by a factor of 1.7, and means connected to said second channel means for suppressing alternate half waves in said second channel.

11. Apparatus as claimed in claim 10, wherein said suppression means comprises means for comparing said triangular signal to a threshold value corresponding to a predetermined percentage of said maximum amplitude, thereby generating a comparator output square wave signal, and means connected to said suppression means for multiplying said triangular signal and said comparator output square wave signal thereby suppressing alternate half waves of said triangular signal.

12. Apparatus as claimed in claim 4, wherein said predetermined period of said approximately sinusoidal signal corresonds to a predetermined frequency;
wherein said means for generating said first signal comprises changeover switch means connected to receive said first triangular signal, and switch control means connected to said changeover switch means for switching said changeover switch means at four times said predetermined frequency and upon occurrence of a selected one of said minimum or said maximum amplitude of said first triangular signal;
wherein said combined signal has periodic minimum amplitudes;
and wherein said inverting means comprises additional switch means, and subtraction circuit means connected to said additional switch means.

13. Apparatus as claimed in claim 12, wherein said changeover switch means compirses a first changeover transistor having an emitter, collector and base, and a second changeover transistor having an emitter coupled to said emitter of said first changeover transistor, said second changeover transistor further having a collector and a base, and means for applying a square wave voltage to said bases of said first and second changeover transistors; and
wherein said superimposing means comprises means for applying said second triangular signal to said collector of said second changeover transistor.

14. Apparatus as claimed in claim 13, wherein said additional switch means comprises a first and second switch transistor each having an emitter, collector and a base, means connecting said collector of said second changeover transistor to said emitters of said first and second switch transistors, and means for applying a square wave voltage to the base of said first and second switch transistor.

15. Apparatus as claimed in claim 13 further comprising voltage controlled oscillator means, and additional circuit means connected to said voltage controlled oscillator means for generating said square wave voltages and said triangular signals under control of said voltage controlled square wave oscillator means.

* * * * *